United States Patent
Lee et al.

(10) Patent No.: US 8,040,677 B2
(45) Date of Patent: Oct. 18, 2011

(54) PLASMA DISPLAY DEVICE

(75) Inventors: Won Jung Lee, Gumi-si (KR); Seung Hoon Lee, Gumi-si (KR)

(73) Assignee: LG Electronics Inc., Seoul (KR)

( * ) Notice: Subject to any disclaimer, the term of this patent is extended or adjusted under 35 U.S.C. 154(b) by 218 days.

(21) Appl. No.: 12/474,612

(22) Filed: May 29, 2009

(65) Prior Publication Data

US 2010/0008050 A1  Jan. 14, 2010

(30) Foreign Application Priority Data

Jul. 14, 2008 (KR) ........................ 10-2008-0068115

(51) Int. Cl.
  *H05K 7/20* (2006.01)
(52) U.S. Cl. .................... 361/719; 361/704; 361/715
(58) Field of Classification Search .................... 361/715
See application file for complete search history.

(56) References Cited

U.S. PATENT DOCUMENTS

| | | | | |
|---|---|---|---|---|
| 5,812,375 A * | 9/1998 | Casperson | .................... | 361/707 |
| 6,222,732 B1 * | 4/2001 | Jakob et al. | .................... | 361/704 |
| 6,359,784 B1 * | 3/2002 | Stevens | .................... | 361/704 |
| 7,023,699 B2 * | 4/2006 | Glovatsky et al. | .................... | 361/704 |
| 7,551,445 B2 * | 6/2009 | Kim et al. | .................... | 361/704 |
| 2001/0024198 A1 * | 9/2001 | Oishi et al. | .................... | 345/204 |
| 2005/0083646 A1 * | 4/2005 | Bae et al. | .................... | 361/686 |
| 2005/0088092 A1 * | 4/2005 | Kim et al. | .................... | 313/582 |
| 2005/0259401 A1 * | 11/2005 | Han et al. | .................... | 361/704 |
| 2006/0227511 A1 * | 10/2006 | Jeong | .................... | 361/715 |
| 2007/0018577 A1 * | 1/2007 | Hwang | .................... | 313/582 |
| 2007/0267174 A1 * | 11/2007 | Kim | .................... | 165/80.3 |

* cited by examiner

*Primary Examiner* — Gregory Thompson
(74) *Attorney, Agent, or Firm* — Ked & Associates LLP

(57) ABSTRACT

A plasma display device includes a circuit board on which a driving circuit is to be mounted and a first heat sink fastened to one side surface of a semiconductor device, the first heat sink being disposed spaced apart from the circuit board, and the semiconductor device being disposed between the first heat sink and the circuit board. By improving the heat dissipation characteristics of a plasma display panel, a more stable display device can be provided and the thickness of the plasma display device can be reduced. Further, rocking of the semiconductor device can be decreased, and the possibility of damage can be reduced.

14 Claims, 7 Drawing Sheets

PLASMA DISPLAY DEVICE

The present application claims priority to Korean Application No. 10-2008-0068115 filed in Korea on Jul. 14, 2008, the entire contents of which are hereby incorporated by reference in their entirety.

BACKGROUND OF THE INVENTION

1. Field of the Invention

The present invention relates to a plasma display device, and more particularly, to a plasma display device which can improve heat dissipation characteristics and reduce its thickness by changing a heat radiation structure.

2. Discussion of the Related Art

A plasma display panel (PDP) excites a phosphor by vacuum ultraviolet rays (VUV) generated when mixtures of inert gases are discharged to emit light and to display an image.

The PDP can be easily made large, thin, and simple so that the PDP can be easily manufactured and has higher brightness and emission efficiency than other flat panel displays. In particular, since an alternate current surface discharge type three electrode plasma display panel has wall charges accumulated on the surface thereof during discharge to protect electrodes from sputtering generated by the discharge, the AC surface discharge type three electrode PDP is driven at a low voltage and has a long life.

In order to drive the PDP, drivers for supplying driving signals to the electrodes formed on the panel are required.

Much heat is generated in a driving circuit of the PDP, and in particular, a switching operation is performed too frequently for a sustain discharge according to screen brightness. Therefore, too much heat is generated during driving of the PDP, and picture quality characteristics are degraded due to local heat dissipation of the panel.

Moreover, in the case that a heat dissipation device, such as a heat sink, is made large to enhance heat generation characteristics, this results in a cost increase and an increase in the overall thickness of a plasma display device, thereby restricting the design.

SUMMARY OF THE INVENTION

A plasma display device according to the present invention includes: a plasma display panel; a driving circuit including at least one semiconductor device and supplying driving signals to the panel; a circuit board on which the driving circuit is to be mounted; and a first heat sink fastened to one side surface of the semiconductor device, the first heat sink being disposed spaced apart from the circuit board, and the semiconductor device being disposed between the first heat sink and the circuit board.

Another plasma display device according to the present invention includes: a plasma display panel; a driving circuit including at least one semiconductor device and supplying driving signals to the panel; a circuit board on which the driving circuit is to be mounted; and a first heat sink spaced apart from the circuit board and fastened to a first surface of the semiconductor device, the semiconductor device being disposed between the first heat sink and the circuit board, and a conductive connection terminal being disposed on a second surface of the semiconductor device adjacent to the first surface of the semiconductor device for electrically connecting the circuit board and the semiconductor device.

Still another plasma display device according to the present invention includes: a plasma display panel; a driving circuit including at least one semiconductor device and supplying driving signals to the panel; a circuit board on which the driving circuit is to be mounted; and a first heat sink fastened to one side surface of the semiconductor device, the semiconductor device being disposed spaced apart from the circuit board, the semiconductor device being disposed between the first heat sink and the circuit board, and a first surface having a larger surface area, among first and second surfaces of the semiconductor device adjacent to each other, being fastened to the first heat sink.

According to the present invention, heat dissipation characteristics of the plasma display panel can be enhanced, a more stable plasma display device can be provided by reducing rocking of the semiconductor device, and the thickness of the plasma display device can be reduced.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE EMBODIMENTS

Figure 1:
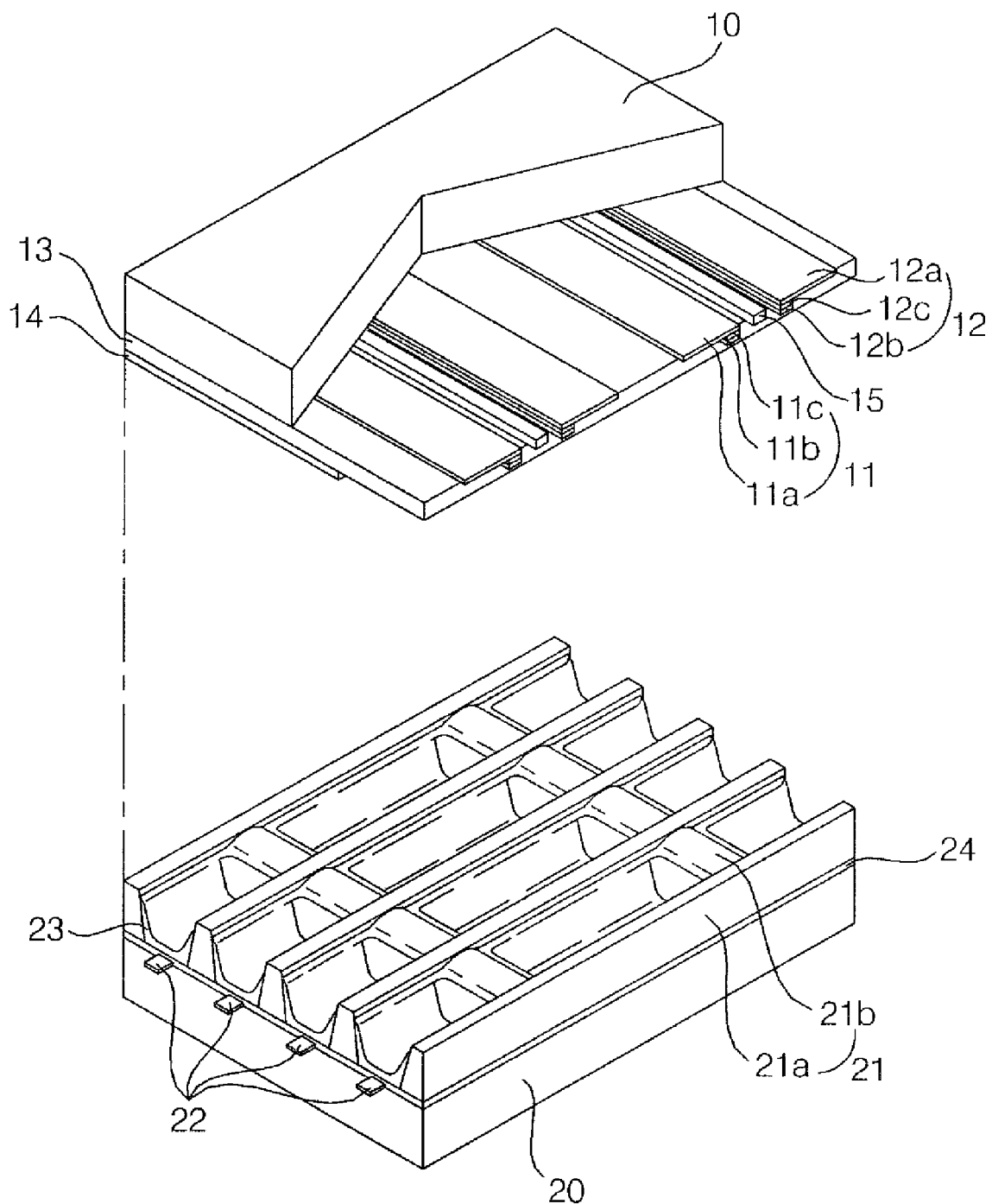
FIG. 1 is a perspective view illustrating the structure of a plasma display panel according to an exemplary embodiment of the present invention.

Hereinafter, a plasma display device according to the present invention will be described in detail with reference to the attached drawings. FIG. 1 is a perspective view illustrating the structure of a plasma display panel according to an exemplary embodiment of the present invention.

As illustrated in FIG. 1, the plasma display panel includes a scan electrode 11 and a sustain electrode 12 that are a pair of sustain electrodes formed on a top substrate 10 and address electrodes 22 formed on a bottom substrate 20.

The pair of sustain electrodes 11 and 12 include transparent electrodes 11a and 12a and bus electrodes 11b and 12b that are typically formed of indium tin oxide (ITO). The bus electrodes 11b and 12b can be formed of a metal such as Ag and Cr or a laminated structure of Cr/Cu/Cr or a laminated structure of Cr/Al/Cr. The bus electrodes 11b and 12b are formed on the transparent electrodes 11a and 12a to reduce a voltage reduction caused by the transparent electrodes 11a and 12a having high resistance.

On the other hand, according to an exemplary embodiment of the present invention, the pair of sustain electrodes 11 and 12 can be formed by laminating the transparent electrodes 11a and 12a and the bus electrodes 11b and 12b and can be formed of only the bus electrodes 11b and 12b without the transparent electrodes 11a and 12a. In such a structure, since the transparent electrodes 11a and 12a are not used, the manufacturing cost of the panel can be reduced. The bus electrodes 11b and 12b having such a structure can be formed of various materials such as photosensitive materials, in addition to the materials listed above.

A black matrix (BM) 15 that absorbs external light generated in the outside of the top substrate 10 to reduce reflection and that improves the purity and the contrast of the top substrate 10 is provided between the transparent electrodes 11a and 12a and the bus electrodes 11b and 11c of the scan electrode 11 and the sustain electrode 12.

The black matrix 15 according to an exemplary embodiment of the present invention formed on the top substrate 10 can include a first black matrix 15 formed to overlap barrier ribs 21 and second black matrixes 11c and 12c formed between the transparent electrodes 11a and 12a and the bus electrodes 11b and 12b. Here, the first black matrix 15 and the second black matrixes 11c and 12c referred to as black layers or black electrode layers can be simultaneously formed to be physically connected to each other or may not be simultaneously formed not to be physically connected to each other in the formation process.

In addition, when the first black matrix 15 and the second black matrixes 11c and 12c are physically connected to each other, the first black matrix 15 and the second black matrixes 11c and 12c are formed of the same material. However, when the first black matrix 15 and the second black matrixes 11c and 12c are physically separated from each other, the first black matrix 15 and the second black matrixes 11c and 12c can be formed of different materials.

An upper dielectric layer 13 and a protective layer 14 are laminated on the top substrate 10 where the scan electrode 11 and the sustain electrode 12 are formed in parallel. Charged particles generated by discharge are accumulated on the upper dielectric layer 13 to protect the pair of sustain electrodes 11 and 12. The protective layer 14 protects the upper dielectric layer 13 against the sputtering of the charged particles generated during gas discharge and improves the emission efficiency of secondary electrons.

In addition, the address electrodes 22 are formed to intersect the scan electrode 11 and the sustain electrode 12. In addition, a lower dielectric layer 24 and the barrier ribs 21 are formed on the bottom substrate 20 where the address electrodes 22 are formed.

In addition, phosphor layers 23 are formed on the surfaces of the lower dielectric layer 24 and the barrier ribs 21. In the barrier ribs 21, vertical barrier ribs 21a and horizontal barrier ribs 21b are formed to be closed. The barrier ribs 21 physically partition off discharge cells and prevent UV rays and visible rays generated by the discharge from leaking to adjacent discharge cells.

According to an exemplary embodiment of the present invention, various shaped barrier ribs 21 as well as the barrier ribs 21 illustrated in FIG. 1 can be formed. For example, differential barrier ribs in which the height of the vertical barrier ribs 21a is different from the height of the horizontal barrier ribs 21b, channel type barrier ribs in which channels that can be used as air discharging paths are formed in at least one of the vertical barrier ribs 21a and the horizontal barrier ribs 21b, and hollow type barrier ribs in which hollows are formed in at least one of the vertical barrier ribs 21a and the horizontal barrier ribs 21b can be formed.

Here, in the differential barrier ribs, the height of the horizontal barrier ribs 21b is preferably higher than the height of the vertical barrier ribs 21a. In the channel type barrier ribs and the hollow type barrier ribs, the channels and the hollows are preferably formed in the horizontal barrier ribs 21b.

On the other hand, according to an exemplary embodiment of the present invention, it is illustrated and described that the R, G, and B discharge cells are arranged on the same line. However, the R, G, and B can be arranged in different shapes. For example, delta type arrangement in which the R, G, and B discharge cells are triangularly arranged can be provided. In addition, the discharge cells can be polygonal such as square, pentagonal, and hexagonal.

In addition, the phosphor layers 23 emit light by the UV rays generated during the gas discharge to generate one visible ray among red R, green G, and blue B visible rays. Here, an inert gas mixture such as He+Xe, Ne+Xe, and He+Ne+Xe for discharge is injected into discharge spaces provided between the top and bottom substrates 10 and 20 and the barrier ribs 21.

Figure 2:
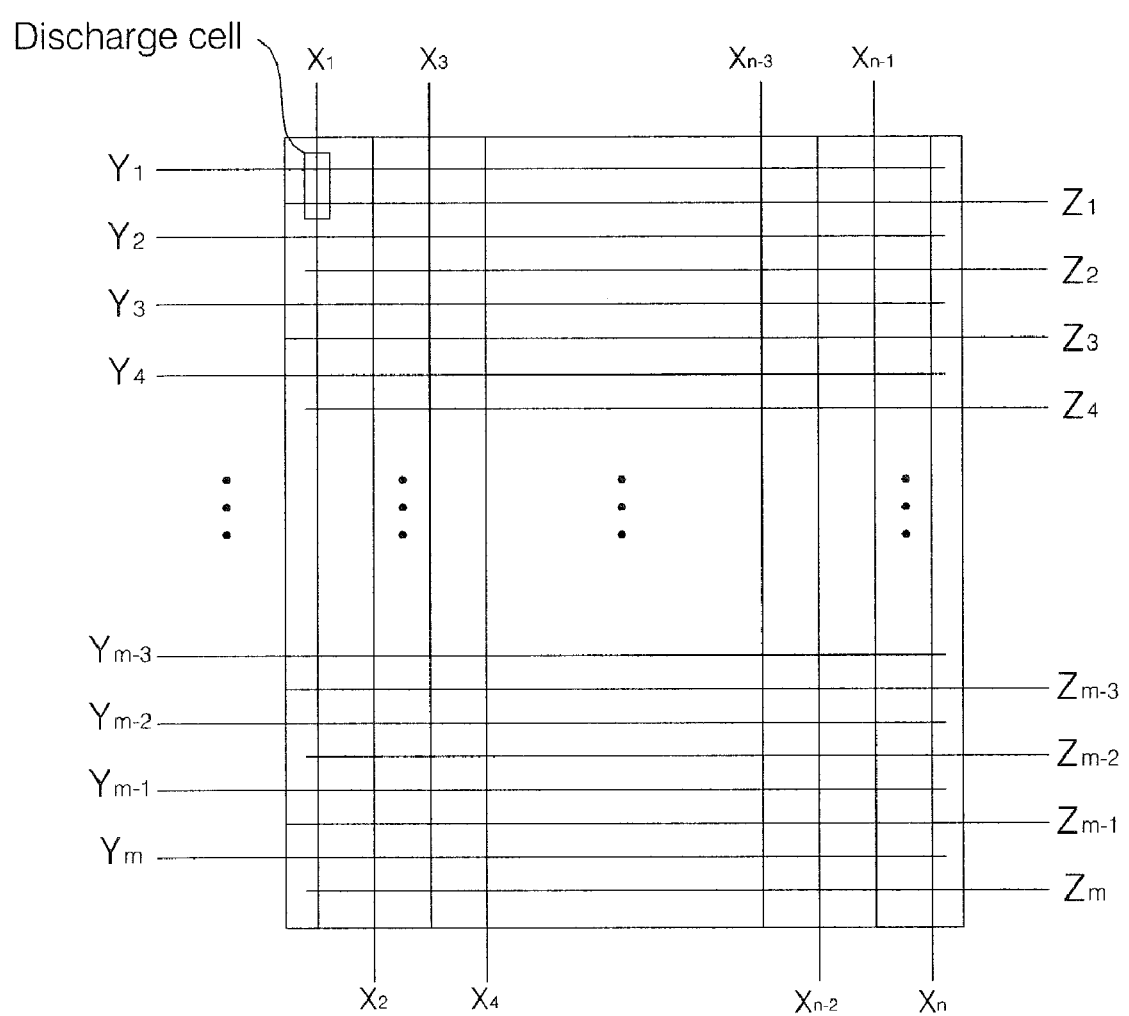
FIG. 2 illustrates the arrangement of the electrodes of the plasma display panel according to an exemplary embodiment of the present invention.

FIG. 2 illustrates the arrangement of the electrodes of the plasma display panel according to an exemplary embodiment of the present invention. As illustrated in FIG. 2, the plurality of discharge cells that constitute the plasma display panel are preferably arranged in a matrix. The plurality of discharge cells are provided in the intersections of scan electrode lines Y1 to Ym, sustain electrode lines Z1 to Zm, and address electrode lines X1 to Xn. The scan electrode lines Y1 to Ym can be sequentially or simultaneously driven. The sustain electrode lines Z1 to Zm can be simultaneously driven. The address electrode lines X1 to Xn can be divided into odd lines and even lines to be driven or can be sequentially driven.

Since the electrode arrangement illustrated in FIG. 2 is only an embodiment of the electrode arrangement of the plasma display panel according to the present invention, the present invention is not limited to the electrode arrangement and driving method of the plasma display panel illustrated in FIG. 2. For example, a dual scanning method in which two scan electrode lines among the scan electrode lines Y1 to Ym are simultaneously scanned can be provided. In addition, the address electrode lines X1 to Xn can be divided up and down in the center of the panel to be driven.

Figure 3:
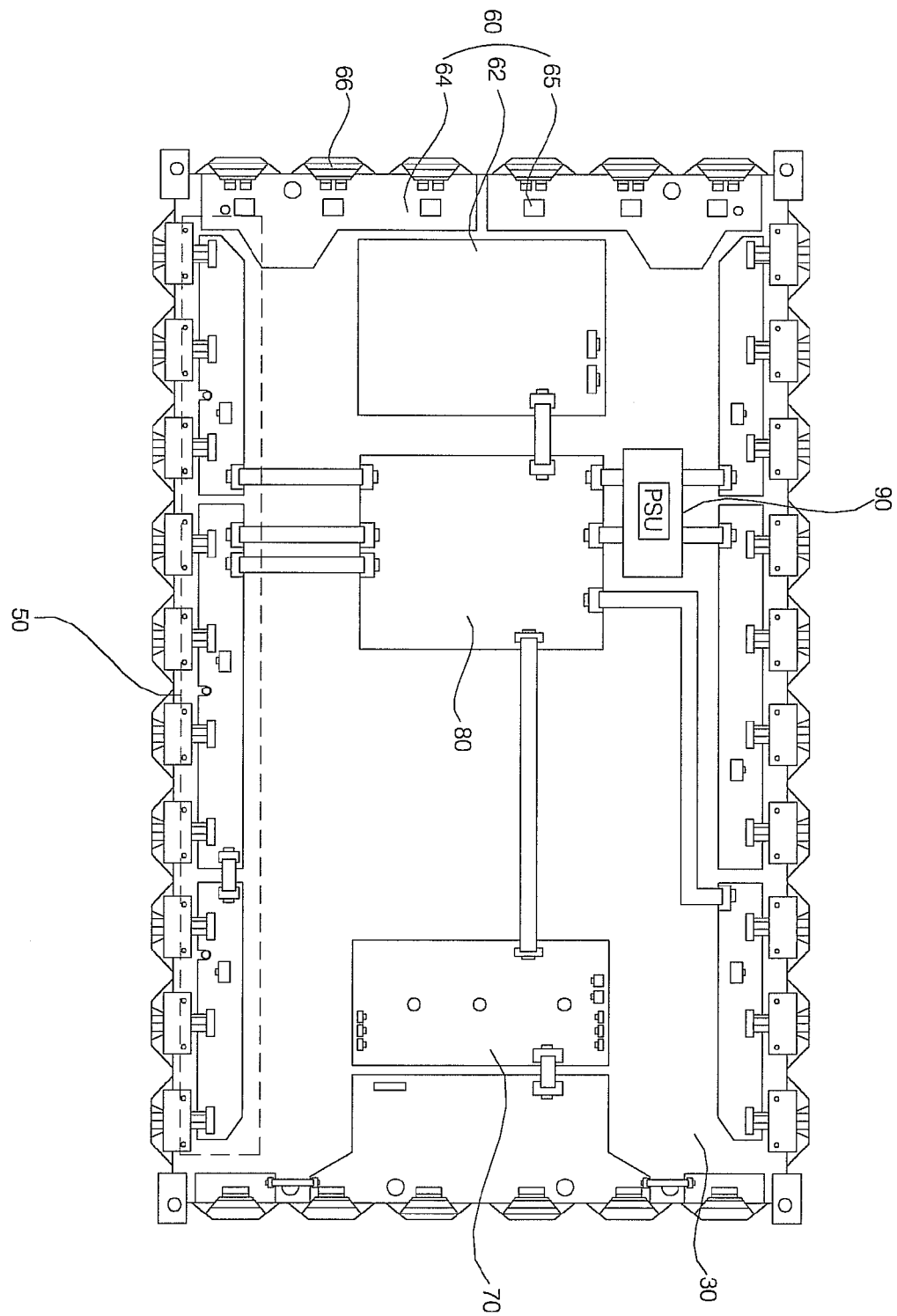
FIG. 3 illustrates the configuration of a driving device for driving the plasma display panel according to an exemplary embodiment of the present invention.

FIG. 3 illustrates the configuration of a driving device for driving the plasma display panel according to an exemplary embodiment of the present invention.

Referring to FIG. 3, a heat discharging frame 30 is provided on the rear surface of the panel to support the panel and to absorb heat generated by the panel and discharge the generated heat. In addition, a printed circuit boards (PCB) that applies the driving signals to the panel is provided on the rear surface of the heat discharging frame 30.

On the PCB (illustratively shown by reference numeral 320 in FIGS. 6-10), an address driver 50 for supplying driving signals to the address electrodes of the panel, a scan driver 60 for supplying driving signals to the scan electrodes of the panel, a sustain driver 70 for supplying driving signals to the sustain electrodes of the panel, a driving controller 80 for controlling the driving circuits, and a power supply unit (PSU) 90 for supplying a power source to driving circuits, respectively may be disposed.

The address driver 50 supplies the driving signals to the address electrodes formed on the panel to select only discharged discharge cells among the plurality of discharge cells formed on the panel.

The address driver 50 can be provided in one or all of the upper side and the lower side of the panel in accordance with a single scan method or a dual scan method.

A data integrated circuit (not shown) is provided in the address driver 50 to control current applied to the address electrodes. Switching is generated in the data IC to control the applied current so that a large amount of heat can be generated. Therefore, a heat sink (not shown) can be provided in the address driver 50 in order to discharge the heat generated in the controlling process.

As illustrated in FIG. 3, the scan driver 60 can include a scan sustain board 62 connected to the driving controller 80 and a scan driver board 64 for connecting the scan sustain board 62 to the panel.

The scan driver board 64 can be divided into the upper side and the lower side. One scan driver board 64 can be provided or a plurality of scan driver boards 64 can be provided unlike as illustrated in FIG. 3.

A scan IC 65 for supplying the driving signals to the scan electrodes of the PDP is provided in the scan driver board 64. The scan IC 65 can continuously apply reset, scan, and sustain signals to the scan electrodes.

The sustain driver 70 supplies the driving signals to the sustain electrodes of the panel.

The driving controller 80 performs predetermined signal processing for input image signals using signal processing information stored in a memory to convert the image signals into data to be supplied to the address electrodes and aligns the converted data in accordance with a scanning order. In addition, the driving controller 80 supplies timing control signals to the address driver 50, the scan driver 60, and the sustain driver 70 to control the driving signal supplying points of time of the driving circuits.

In order to connect the PCB and the scan electrodes of the PDP that are formed opposite to each other on both surfaces of the heat discharging frame 30 as illustrated in FIG. 3, a connection member 66 is preferably comprised of a flexible printed circuit (FPC).

In addition, in order to supply driving signals to the sustain electrodes or address electrode of the panel, the above-mentioned connection member may be connected between the sustain driver 70 and the sustain electrode formed on the panel or between the address driver 50 and the address electrodes formed on the panel.

A plasma display device according to the present invention includes: a plasma display panel; a driving circuit including at least one semiconductor device and supplying driving signals to the panel; a circuit board on which the driving circuit is to be mounted; and a first heat sink fastened to one side surface of the semiconductor device.

The first heat sink is disposed spaced apart from the circuit board, and the semiconductor device is disposed between the first heat sink and the circuit board.

In another exemplary embodiment, the semiconductor device is disposed between the first heat sink and the circuit board, and a conductive connection terminal is disposed on a second surface of the semiconductor device adjacent to the first surface of the semiconductor device for electrically connecting the circuit board and the semiconductor device.

In still another exemplary embodiment, the semiconductor device is disposed between the first heat sink and the circuit board, and a first surface having a larger surface area, among first and second surfaces of the semiconductor device adjacent to each other, is fastened to the first heat sink.

In addition, the circuit board and one side surface of the semiconductor device may be disposed in parallel.

In addition, the first heat sink may include a plurality of heat dissipation fins projecting in a direction opposite to the direction toward the panel, and the semiconductor device may be a diode or an insulation gate bipolar transistor (IGBT).

The plasma display device according to the present invention may further include a second heat sink which is connected to the opposite side of the one side surface of the semiconductor device to which the first heat sink is fastened.

In addition, the second heat sink may include a projecting portion through which a fastening member passes, and may have a thermal pad attached to at least one side thereof.

Figure 4:
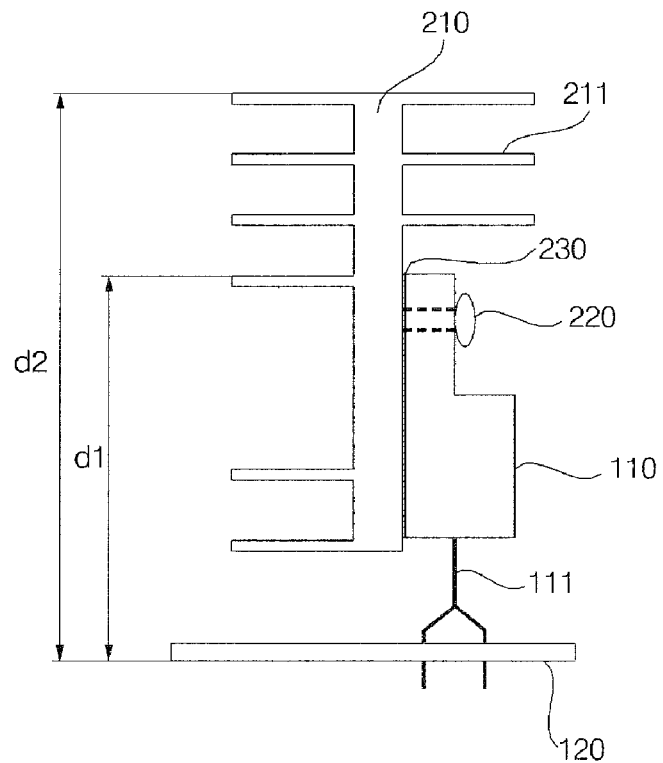
FIGS. 4 and 5 are a side view and a front view of the arrangement structure of a circuit board, a semiconductor device, and a heat sink according to an exemplary embodiment of the present invention.
Figure 5:
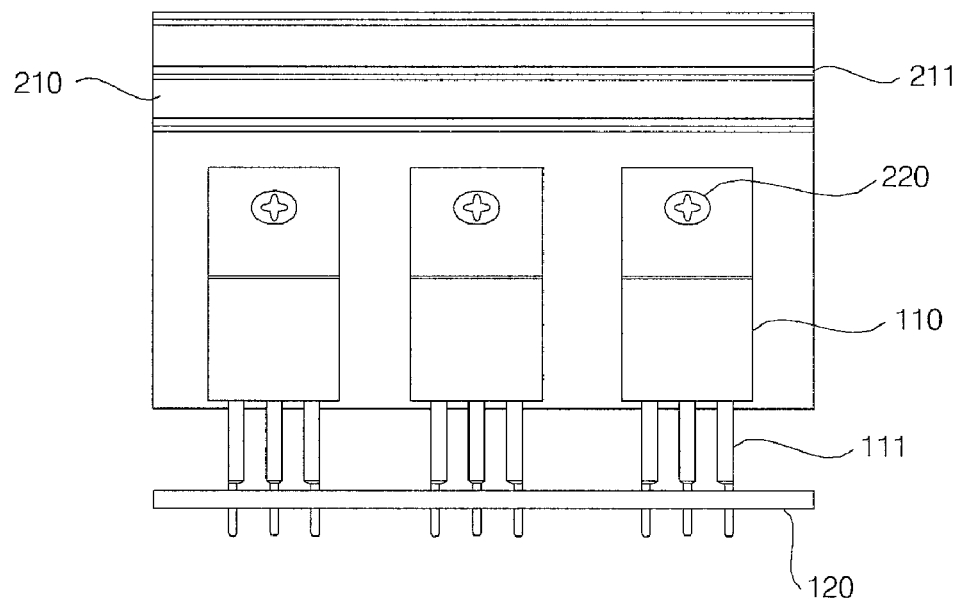

FIGS. 4 and 5 are a side view and a front view of the arrangement structure of a circuit board, a semiconductor device, and a heat sink according to an exemplary embodiment of the present invention.

Referring to FIG. 4, the semiconductor device 110 is mounted in a direction perpendicular to the circuit board 120 by means of a lead line 111. Further, the heat sink 210 is coupled to the semiconductor device 110 by screws 220. The heat sink 210 is formed of a material having good thermal conductivity, such as aluminum, to efficiently emit light to the outside.

The heat sink 210 can increase the heat dissipation surface area and improve the heat dissipation efficiency by including a plurality of heat dissipation fins 211. A base portion of the heat sink 210 is a part which is coupled with the semiconductor device to dissipate heat, and the heat dissipation fins 211 are a part which is increased in the heat dissipation surface area to additionally dissipate the heat transferred from the base portion by contact with air.

In addition, a thermal grease 230 for making the heat dissipation effect better may be added and coupled to a coupling portion for coupling the semiconductor device 110 and the heat sink 210 in an upright position. A package shape of a commercial semiconductor device is configured such that the semiconductor device 110 and the heat sink 210 for heat dissipation are also fastened in an upright position as shown above.

The portion coupled to the heat sink 210 releases heat by the heat sink 210, while a portion not coupled thereto dissipates the heat generated from the semiconductor device 110 by air.

The heat dissipation surface area can be increased by increasing the height of the heat sink 210 according to the degree of heat generation of the driving circuit and the semiconductor device, or the heat dissipation characteristics can be enhanced by increasing the volume of aluminum or the like having good thermal conductivity.

However, this may lead to an increase of the entire thickness of the plasma display device, and therefore impose restrictions on the slim profile of a plasma display device and product design. Moreover, one side surface of the semiconductor device 110 where the heat sink 210 is not disposed cannot bring about the effect of improving heat dissipation characteristics by means of the heat sink 210.

In addition, the heat sink 210 is only fastened to one side surface of the semiconductor device 110 and the opposite side thereof is only in contact with air. Thus, the left/right balance of the semiconductor device 110 may not be stable, and there is no configuration for reducing rocking of the semiconductor device 110.

Consequently, depending on the use environment, there is a risk that the fastening between the semiconductor device and the circuit board may get worse due to rocking of the semiconductor device or the semiconductor device may be damaged.

Referring to FIG. 4, the height d2 of the heat sink 210 is greater than the height d1 of the semiconductor device 110, and heat generated from the entire semiconductor device 110 can be released to the outside. Further, a plurality of heat dissipation fins 211 may be provided to increase the heat dissipation surface area.

Since the height d1 of the semiconductor device 110 is, for example, typically about 20 mm, the entire height of the circuitry cannot be set to less than 20 mm even if the height of the heat sink 210 is reduced at the sacrifice of heat dissipation characteristics. The height d1 of the semiconductor device 110 is one of the most important factors determining the thickness of the circuitry.

FIG. 5 is a front view of the arrangement structure of a circuit board, a semiconductor device, and a heat sink.

Referring to FIG. 5, the semiconductor device 110 is mounted in a direction perpendicular to the circuit board 120 by means of three lead lines 111. Further, the heat sink 210 is fastened to the semiconductor device 110 by fastening means such as screws 220.

The heat sink 210 is connected to the widest surface of the semiconductor device 110 so that heat of the semiconductor device can be rapidly released through the heat sink 210.

Figure 6:
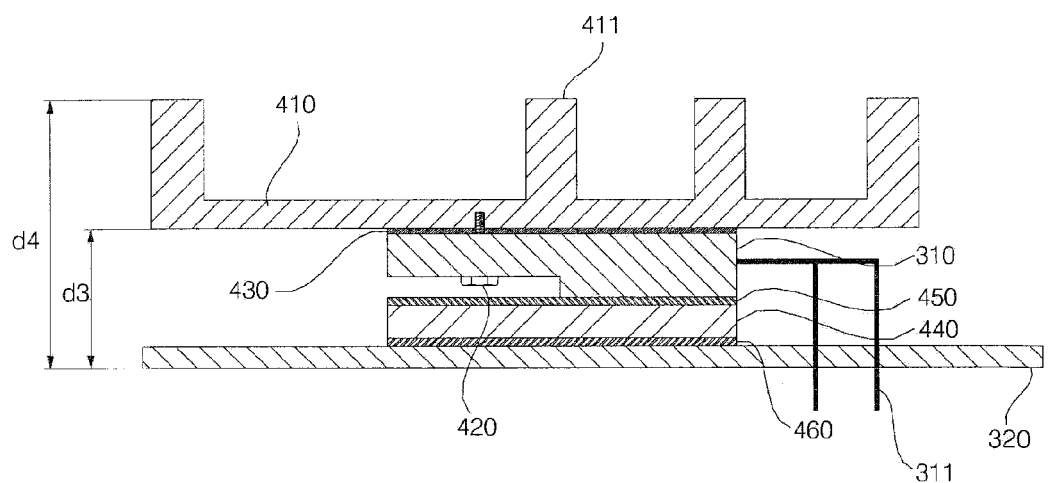
FIGS. 6 and 7 are a side view and a front view of the arrangement structure of a circuit board, a semiconductor device, and a heat sink according to an exemplary embodiment of the present invention.
Figure 7:
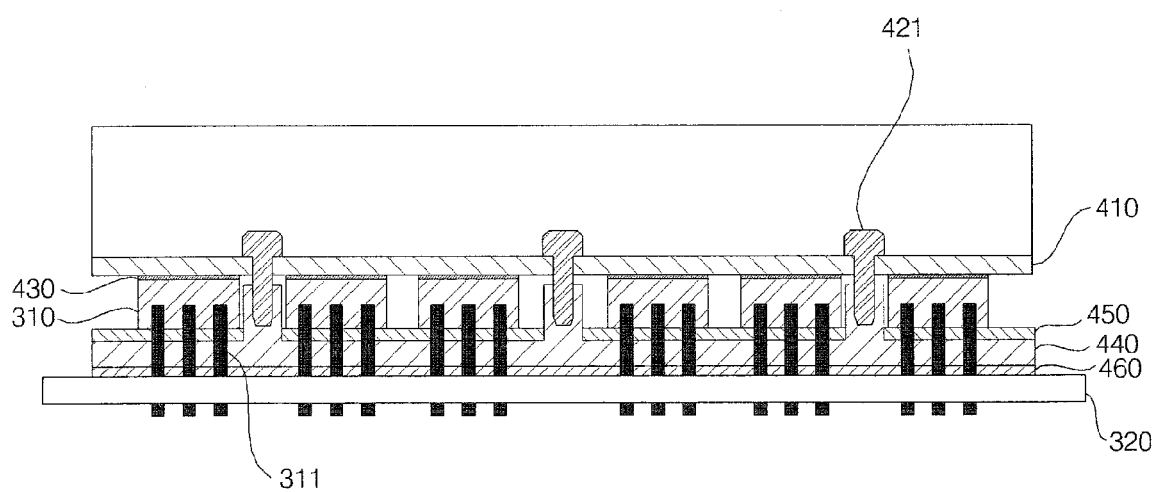

FIGS. 6 and 7 are a side view and a front view of the arrangement structure of a circuit board, a semiconductor device, and a heat sink according to an exemplary embodiment.

Referring to FIG. 6, the plasma display device according to the present invention includes a first heat sink 410 fastened to one side surface of the semiconductor device 310 by screws 420 or the like, the first heat sink 410 is disposed spaced apart from the circuit board 320, and the semiconductor device 310 is disposed in a spacing, i.e., between the first heat sink 410 and the circuit board 320.

A driving circuit for generating driving signals of the panel includes at least one semiconductor device, but the circuitry, other than the semiconductor device 310, is not illustrated herein.

Because the semiconductor device 310 typically has a structure with a narrow width and long sides, the first heat sink 410 is fastened to one wide side surface of the semiconductor device 310 to increase the heat dissipation surface area and heat generated from the semiconductor device 310 is efficiently released through the first heat sink 410.

The first heat sink 410 and the semiconductor device 310 may be fastened by screws 420 or the like after applying a thermal grease 430 for increasing adhesion and for thermal conductivity.

In addition, unlike in FIG. 4 in which the long surface of the semiconductor device 110 is fastened at a right angle to the circuit board 120, the semiconductor device 310 is fastened in a lying-down position between the first heat sink 410, which is fastened to one side surface of the semiconductor device 310, and the circuit board 320 and hence the height of the entire circuitry can be reduced. Consequently, the thickness of the plasma display device can be reduced.

In addition, in the present invention, the upper side and lower side of the semiconductor device 110 are fixed in both directions by the first heat sink 410 and the circuit board 120, respectively, and a pressure applied to the semiconductor device 110 can be adjusted to avoid left-right deviation.

Consequently, rocking of the semiconductor device 110 can be reduced and the possibility of damage of the semiconductor device 110 can be decreased.

More preferably, the circuit board 320 and one side surface of the semiconductor device 410 are disposed in parallel so that the height of the circuitry can be the smallest compared to the case where they are disposed at an oblique inclination, and accordingly this is effective to reduce the thickness of the plasma display device.

The first heat sink 410 may include a plurality of heat dissipation fins 411 projecting in a direction opposite to the direction toward the panel or the circuit board 320. Since the heat dissipation surface area increases in proportion to the number of the heat dissipation fins 411 attached, the heat dissipation characteristics can be improved.

The semiconductor device 310 may be a diode or an insulation gate bipolar transistor (IGBT).

As a PDP has a higher luminance and a larger screen size, currents for use become larger. In case of the IGBT, it is difficult to make unit devices for processing large currents and the heat generation amount of individual devices is very large, thus increasing the possibility of damage to the devices caused by heat generation. Therefore, because the sum of heat generation amounts of diodes or IGBTs increases in a switching operation, the heat dissipation characteristics are enhanced by fastening the first heat sink 410 or the like.

The plasma display device according to the present invention may further include a second heat sink 440 which is connected to the opposite side of the one side surface of the semiconductor device 310 to which the first heat sink 410 is fastened.

By fastening the second heat sink 440 to one side surface of the semiconductor device 310 to which the first heat sink 410 is not fastened, the heat dissipation characteristics can be enhanced. As described above, one side surface of the semiconductor device 310 to which the first heat sink 410 is coupled to the semiconductor device 310 releases heat by means of the first heat sink 410, and one side surface of the semiconductor device 310 to which the second heat sink 440 is coupled releases heat by means of the second heat sink 440. Portions to which the heat sinks are not coupled release heat of the semiconductor device 310 directly by air.

In addition, as shown in FIG. 7, the second heat sink 440 may include projecting portions through which fastening members pass. Holes are formed in the projecting portions for allowing fastening members such as screws 421 to pass through so that the first heat sink 410 can be more firmly fastened.

The semiconductor device 310 may be mounted in parallel to the circuit board 320 by bending a conductive connection terminal (for example, three lead lines) 311.

In addition, the second heat sink 440 may be configured such that an additional thermal pad is attached to at least one side thereof to improve the heat dissipation characteristics. FIGS. 6 and 7 illustrate an exemplary embodiment in which thermal pads are attached to both sides of the second heat sink 440.

The first thermal pad 450 and the second thermal pad 460 are manufactured by mixing urethane with silicone having elasticity, and a thermal conductive adhesive may be applied to the front and back surfaces of the manufactured thermal conductive pads. As the adhesive, an acrylic material can be used.

The first thermal pad 450 is inserted between the second heat sink 440 and the semiconductor device 310 to improve insulation, thermal conduction, and flatness, and the second thermal pad 460 is inserted between the second heat sink 440 and the circuit board 320 to improve insulation, thermal conduction and flatness.

As heat dissipation is done by attaching the heat dissipation devices in two directions as shown above, the heat dissipation efficiency is improved. Thus, the height of the heat dissipation fins 411 can be lowered or the number thereof can be reduced compared to the case where heat dissipation is done only in one direction.

In addition, the plasma display device having a fastening structure according to the present invention is mounted in a lying-down position so that the long side surface of the semiconductor device 310 may not reach the height of the circuitry as described above. Therefore, the height from the circuit board 320 to the semiconductor device 310 may be set to be about 35% of d1 even when the same parts as those in FIG. 4 are used even in the structure including all of the second heat sink 440, first thermal pad 450, and second thermal pad 460.

In a concrete example, in case of using a general-purpose To-220 package in which the height d1 of the semiconductor device mounted in the circuit board is approximately 20 mm, if the package is mounted in an upright position, the height of the circuitry is no less than 20 mm even if the heat sink is excluded. However, according to the present invention, the thickness of the thermal pads is less than 1 mm, and hence d3 can be embodied as being 6.5 mm or so.

In addition, the height d4 of the circuitry including the first heat sink 410 provided with the heat dissipation fins 411 having a height of approximately 11.0 mm also can be embodied as being about 18.0 mm or so. Therefore, the height d4 of the entire circuitry may be set to be lower than d1, thus reducing the thickness of the plasma display device.

Figure 8:
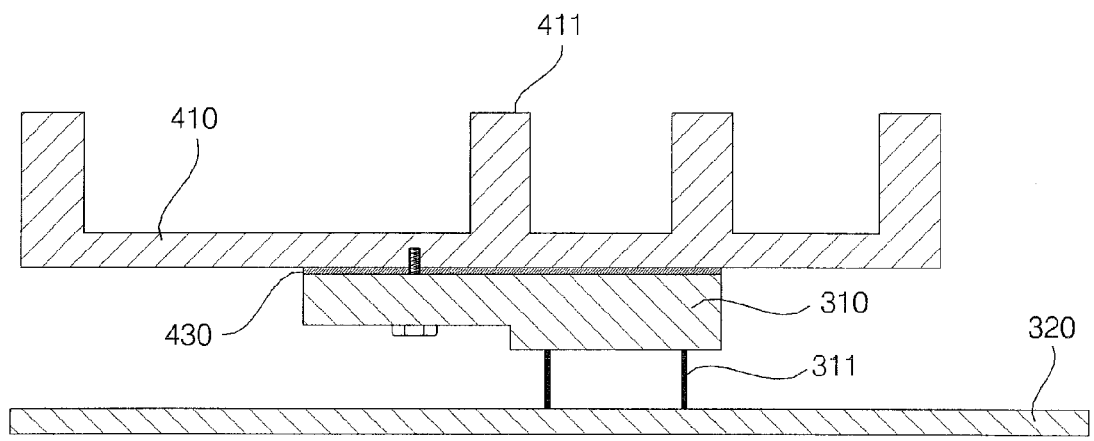
FIG. 8 is a side view of the arrangement structure of a circuit board, a semiconductor device, and a heat sink according to an exemplary embodiment of the present invention.

FIG. 8 is a side view of the arrangement structure of a circuit board, a semiconductor device, and a heat sink according to an exemplary embodiment.

In the plasma display according to the present invention, as shown in FIG. 6, the semiconductor device may be mounted in parallel to the circuit board 320 by bending three lead lines, and as shown in FIG. 8, may be mounted in the circuit board 320 by connecting the lead lines 311 onto a surface most adjacent to the circuit board 320 of the semiconductor device 310.

In this case, other components may be configured in the same way as in FIG. 6.

Figure 9:
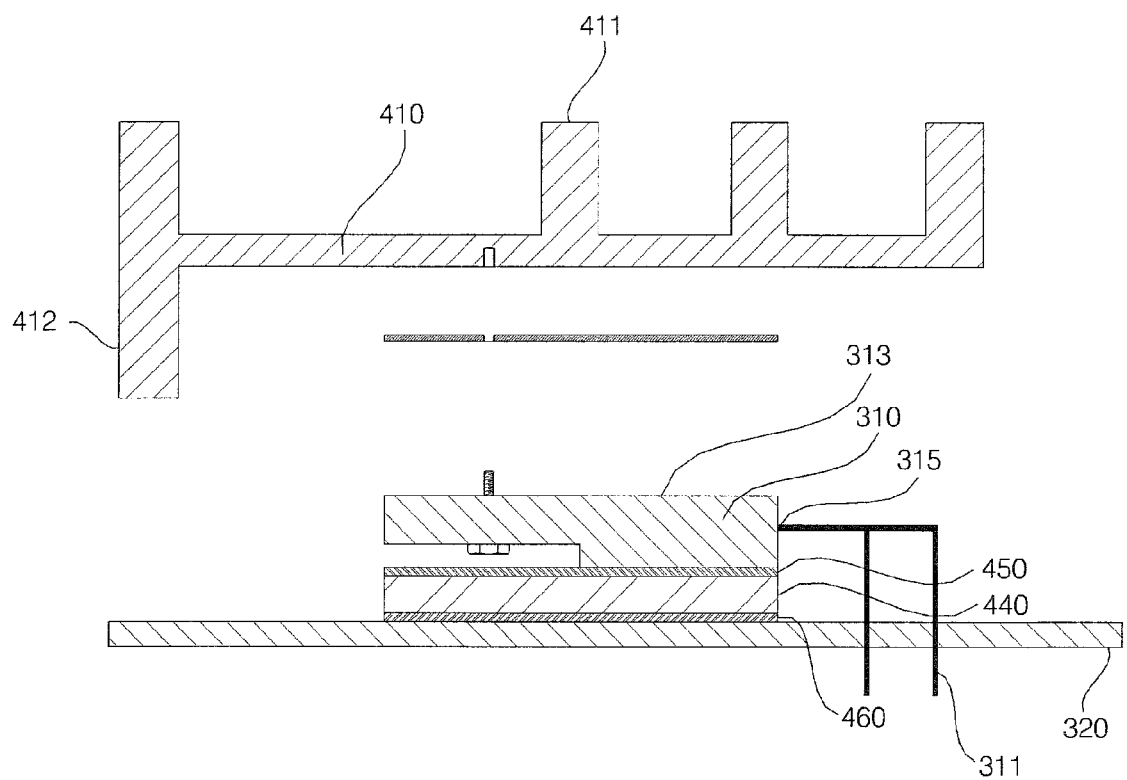
FIG. 9 is a side view of the arrangement structure of a circuit board, a semiconductor device, and a heat sink according to an exemplary embodiment of the present invention.

FIG. 9 is a side view of the arrangement structure of a circuit board, a semiconductor device, and a heat sink according to an exemplary embodiment.

The exemplary embodiment of FIG. 9 shares its main features in common with the exemplary embodiment of FIG. 6, so portions of this exemplary embodiment overlapping with those of FIG. 6 will not be described or will be briefly described.

Referring to FIG. 9, the plasma display device according to the present invention includes a first heat sink 410 spaced apart from the circuit board 320 and fastened to a first surface 313 of the semiconductor device 310, the semiconductor device 310 is disposed between the first heat sink 410 and the circuit board 320, and a conductive connection terminal 311 electrically connecting the circuit board 320 and the semiconductor 310 is disposed on a second surface 315 of the semiconductor device 310 adjacent to the first surface 313 of the semiconductor device 310.

A driving circuit for supplying driving signals to the panel includes at least one semiconductor device, but the circuitry other than the semiconductor device 310 is not illustrated herein.

The conductive connection terminal 311, for example, three lead lines, are bent and connected to the circuit board 320 and a side surface of the semiconductor device 310, so that the height occupied by the length of the conductive connection terminal 311 can be minimized. Therefore, this is also effective to reduce the entire height of the plasma display device.

Further, the circuit board 320 and the first surface 313 of the semiconductor device may be parallel to each other, and the semiconductor device 310 may be a diode or an insulation gate bipolar transistor.

In addition, the first heat sink 410 may include a plurality of heat dissipation fins 411 projecting in a direction opposite to the direction toward the panel or the circuit board 320, and may further include at least one heat dissipation fin 412 in a direction toward the circuit board 320 as well. Since the heat dissipation surface area increases in proportion to the number of the heat dissipation fins 411 and 412 attached, the heat dissipation characteristics can be further improved.

In this case, too, as shown in the exemplary embodiment of FIG. 6, a second heat sink 440 to be connected to the opposite side of the first surface 313 of the semiconductor device, and the second heat sink 440 may include projecting portions through which fastening members pass.

In addition, the second heat sink 440 may have thermal pads 450 and 460 attached to at least one side thereof to further improve the heat dissipation characteristics.

Figure 10:
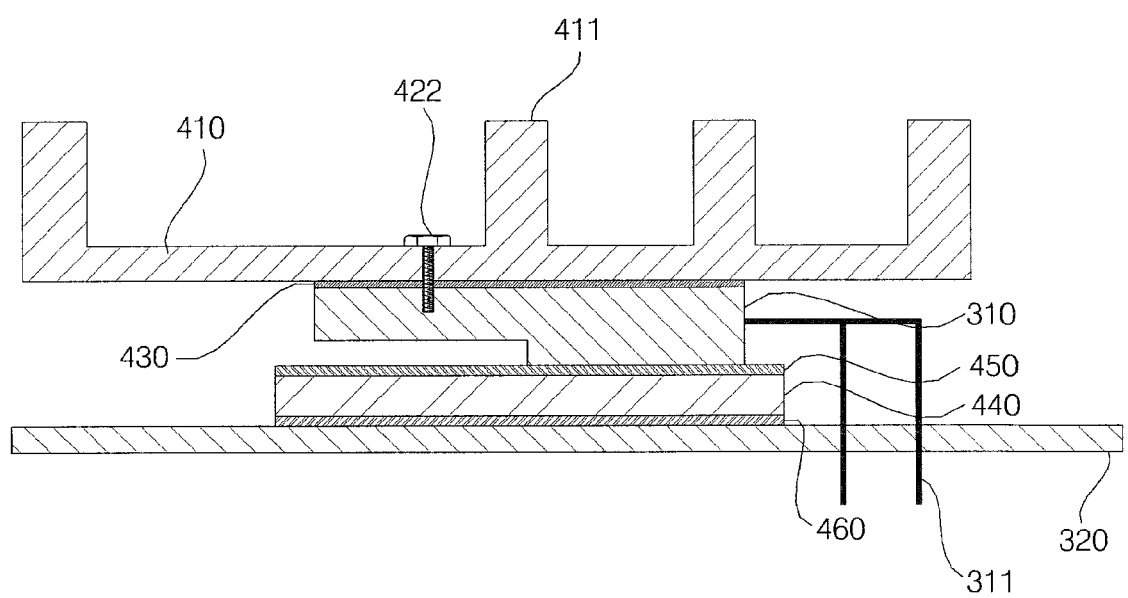
FIG. 10 is a side view of the arrangement structure of a circuit board, a semiconductor device, and a heat sink according to an exemplary embodiment of the present invention.

FIG. 10 is a side view of the arrangement structure of a circuit board, a semiconductor device, and a heat sink according to an exemplary embodiment.

The exemplary embodiment of FIG. 10 also shares its main features in common with the exemplary embodiment of FIG. 6, so portions of this exemplary embodiment overlapping with those of FIG. 6 will not be described or will be briefly described.

A plasma display device according to the present invention includes: a plasma display panel; a driving circuit including at least one semiconductor device 310 and supplying driving signals to the panel; a circuit board 320 on which the driving circuit is to be mounted; and a first heat sink 410 fastened to one side surface of the semiconductor device, the first heat sink 410 being disposed spaced apart from the circuit board 320, the semiconductor device 310 being disposed between the first heat sink 410 and the circuit board 320, and a first surface having a larger surface area, among first and second surfaces of the semiconductor device 310 adjacent to each other, being fastened to the first heat sink 410.

A driving circuit for generating driving signals of the panel includes at least one semiconductor device, but the circuitry other than the semiconductor device 310 is not illustrated herein.

Because the semiconductor device 310 typically has a structure with a narrow width and long sides, the first heat sink 410 is fastened to one wide side surface of the semiconductor device 310 to increase the heat dissipation surface area and heat generated from the semiconductor device 310 is efficiently released through the first heat sink 410.

More preferably, the first heat sink 410 is fastened to the surface having the largest surface area of the semiconductor device 310, and the second heat sink 440 is connected to the surface having the second largest surface area.

In this case, too, as shown in the exemplary embodiment of FIG. 6, a second heat sink 440 to be connected to the opposite side of the first surface 313 of the semiconductor device, and the second heat sink 440 may include projecting portions through which fastening members pass.

As shown in FIG. 10, fastening means such as screws 422 may be fastened from the first heat sink 410 to the semiconductor device 310, or as shown in FIG. 6, fastening means such as screws 420 may be fastened from the semiconductor device 310 to the first heat sink 410.

In addition, the semiconductor device 310 may be a diode or an insulation gate bipolar transistor, and the first heat sink 410 may include a plurality of heat dissipation fins 411 projecting in a direction opposite to the direction toward the panel or the circuit board 320.

In addition, the second heat sink 440 may have thermal pads 450 and 460 attached to at least one side thereof, and the second heat sink 440 and the thermal pads 450 and 460 may be larger than the semiconductor device 310.

The first thermal pad 450 is inserted between the second heat sink 440 and the semiconductor device 310 to improve insulation, thermal conduction, and flatness, and the second thermal pad 460 is inserted between the second heat sink 440 and the circuit board 320 to improve insulation, thermal conduction and flatness.

According to the present invention, by improving the heat dissipation characteristics of the plasma display panel, a more stable display device can be provided and the thickness of the plasma display device can be reduced. Further, rocking of the semiconductor device can be decreased, and the possibility of damage can be reduced.

While the invention has been shown and described with respect to the preferred embodiments, it will be understood by those skilled in the art that various changes and modifications may be made without departing from the spirit and scope of the invention as defined in the following claims.

What is claimed is:

1. A plasma display device, comprising:
   a plasma display panel;
   a driving circuit including at least one semiconductor device and supplying driving signals to the panel;
   a circuit board on which the driving circuit is to be mounted; and
   a first heat sink coupled to one side surface of the semiconductor device, the first heat sink being disposed spaced apart from the circuit board, and the semiconductor device being disposed between the first heat sink and the circuit board, the plasma display device further comprising:
   a second heat sink which is coupled to an opposite side of the one side surface of the semiconductor device to which the first heat sink is coupled, wherein the second heat sink comprises projecting portions through which fastening members pass.

2. The plasma display device of claim 1, wherein the circuit board and the one side surface of the semiconductor device are disposed in parallel.

3. The plasma display device of claim 1, wherein the first heat sink comprises a plurality of heat dissipation fins projecting in a direction opposite to a direction toward the panel.

4. The plasma display device of claim 1, wherein the semiconductor device is a diode or an insulation gate bipolar transistor (IGBT).

5. The plasma display device of claim 1, wherein the second heat sink has a thermal pad coupled to at least one side thereof.

6. A plasma display device, comprising:
   a plasma display panel;
   a driving circuit including at least one semiconductor device and supplying driving signals to the panel;
   a circuit board on which the driving circuit is to be mounted; and
   a first heat sink spaced apart from the circuit board and coupled to a first surface of the semiconductor device, the semiconductor device being disposed between the first heat sink and the circuit board, and a conductive connection terminal being disposed on a second surface of the semiconductor device adjacent to the first surface of the semiconductor device for electrically connecting the circuit board and the semiconductor device, the plasma display device further comprising:
   a second heat sink which is coupled to an opposite side of the first surface of the semiconductor device, wherein the second heat sink comprises projecting portions through which fastening members pass.

7. The plasma display device of claim 6, wherein the circuit board and the first surface of the semiconductor device are disposed in parallel.

8. The plasma display device of claim 6, wherein the first heat sink comprises a plurality of heat dissipation fins projecting in a direction opposite to a direction toward the panel.

9. The plasma display device of claim 6, wherein the semiconductor device is a diode or an insulation gate bipolar transistor (IGBT).

10. A plasma display device, comprising:
    a plasma display panel;
    a driving circuit including at least one semiconductor device and supplying driving signals to the panel;
    a circuit board on which the driving circuit is to be mounted;
    a first heat sink spaced apart from the circuit board and coupled to a first surface of the semiconductor device, the semiconductor device being disposed between the first heat sink and the circuit board, and a conductive connection terminal being disposed on a second surface of the semiconductor device adjacent to the first surface of the semiconductor device for electrically connecting the circuit board and the semiconductor device; and
    a second heat sink which is coupled to an opposite side of the first surface of the semiconductor device, wherein the second heat sink has a thermal pad fastened to at least one side thereof.

11. A plasma display device, comprising:
    a plasma display panel;
    a driving circuit including at least one semiconductor device and supplying driving signals to the panel;
    a circuit board on which the driving circuit is to be mounted;
    a first heat sink coupled to one side surface of the semiconductor device, the first heat sink being disposed spaced apart from the circuit board, the semiconductor device being disposed between the first heat sink and the circuit board, and a first surface having a larger surface area, among first and second surfaces of the semiconductor device adjacent to each other, being coupled to the first heat sink; and
    a second heat sink which is coupled to an opposite side of the first surface of the semiconductor device to which the first heat sink is coupled, wherein the second heat sink comprises projecting portions through which fastening members pass.

12. The plasma display device of claim 11, wherein the first heat sink comprises a plurality of heat dissipation fins projecting in a direction opposite to the direction toward the panel.

13. The plasma display device of claim 11, wherein the semiconductor device is a diode or an insulation gate bipolar transistor (IGBT).

14. The plasma display device of claim 11, wherein the second heat sink has a thermal pad fastened to at least one side thereof.

* * * * *